(12) United States Patent
Zhang et al.

(10) Patent No.: US 9,816,013 B2
(45) Date of Patent: Nov. 14, 2017

(54) METHODS FOR PREPARING A CARBON NANOTUBE CONDUCTIVE BALL AND A CARBON NANOTUBE BALL CONDUCTIVE ADHESIVE

(71) Applicant: Shenzhen China Star Optoelectronics Technology Co., Ltd., Shenzhen (CN)

(72) Inventors: Xia Zhang, Shenzhen (CN); Yungjui Lee, Shenzhen (CN); Tao Hu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 167 days.

(21) Appl. No.: 14/913,370

(22) PCT Filed: Dec. 28, 2015

(86) PCT No.: PCT/CN2015/099269
§ 371 (c)(1),
(2) Date: Feb. 21, 2016

(87) PCT Pub. No.: WO2017/063290
PCT Pub. Date: Apr. 20, 2017

(65) Prior Publication Data
US 2017/0260426 A1    Sep. 14, 2017

(30) Foreign Application Priority Data
Oct. 14, 2015  (CN) .......................... 2015 1 0662918

(51) Int. Cl.
*C08G 73/02*   (2006.01)
*C09J 9/02*    (2006.01)
(Continued)

(52) U.S. Cl.
CPC ................ *C09J 9/02* (2013.01); *B01J 2/006* (2013.01); *C01B 31/0273* (2013.01);
(Continued)

(58) Field of Classification Search
CPC ....................................................... A61L 27/18
(Continued)

(56) References Cited

U.S. PATENT DOCUMENTS

2010/0075904 A1*  3/2010  Laurencin ............... A61L 27/18
                                                              514/1.1

FOREIGN PATENT DOCUMENTS

| CN | 102134317 A | 7/2011 |
|----|-------------|--------|
| CN | 104559187 A | 4/2015 |

\* cited by examiner

*Primary Examiner* — Khanh Tuan Nguyen
(74) *Attorney, Agent, or Firm* — Leong C. Lei (57) ABSTRACT

The present disclosure provides a method for preparing a carbon nanotube conductive ball and a method for preparing a carbon nanotube ball conductive adhesive. The method for preparing the carbon nanotube conductive ball integrates the advantages of stability of polymer microsphere and $SiO_2$ microsphere, and high conductivity of carbon nanotube, by applying polymer microsphere or $SiO_2$ microsphere as matrix, and plating carbon nanotube material to obtain the spherical carbon nanotube conductive ball. The method is simple, low equipment requirements, abundant raw materials, low cost, and high efficiency, the particle size of the carbon nanotube conductive ball is controllable, the material stability and conductivity of the carbon nanotube conductive ball are excellent. The method for preparing the carbon nanotube ball conductive adhesive adopts carbon nanotube as an electrically conducting particle, which replaces the commonly used conductive gold ball in TFT-LCD field, the disadvantages in traditional conductive adhesive such as high filling content, expensive price, complicated preparation process, environmental pollution, and so on are solved. Besides, the carbon nanotube ball conductive adhesive also has a great prospect in ultra-fine circuit connections.

11 Claims, 5 Drawing Sheets

(51) Int. Cl.

| | | |
|---|---|---|
| *H01L 51/00* | (2006.01) | |
| *H01B 1/04* | (2006.01) | |
| *H01B 13/30* | (2006.01) | |
| *H01B 13/00* | (2006.01) | |
| *C01B 31/02* | (2006.01) | |
| *C09J 163/00* | (2006.01) | |
| *B01J 2/00* | (2006.01) | |
| *B82Y 30/00* | (2011.01) | |
| *B82Y 40/00* | (2011.01) | |
| *C08K 3/04* | (2006.01) | |
| *C08K 7/18* | (2006.01) | |
| *C08K 3/36* | (2006.01) | |

(52) U.S. Cl.
CPC .............. *C09J 163/00* (2013.01); *H01B 1/04* (2013.01); *H01B 13/0036* (2013.01); *H01B 13/30* (2013.01); *H01L 51/0048* (2013.01); *B82Y 30/00* (2013.01); *B82Y 40/00* (2013.01); *C01B 2202/22* (2013.01); *C08K 3/041* (2017.05); *C08K 3/36* (2013.01); *C08K 7/18* (2013.01); *C08K 2201/001* (2013.01); *Y10S 977/742* (2013.01); *Y10S 977/842* (2013.01); *Y10S 977/892* (2013.01); *Y10S 977/932* (2013.01)

(58) Field of Classification Search
USPC ..................................................... 514/1.1, 12
See application file for complete search history.

METHODS FOR PREPARING A CARBON NANOTUBE CONDUCTIVE BALL AND A CARBON NANOTUBE BALL CONDUCTIVE ADHESIVE

FIELD OF THE INVENTION

The present invention relates to a flat panel display technology, and in particular, it relates to a method for preparing a carbon nanotube conductive ball, and a method for preparing a carbon nanotube ball conductive adhesive.

BACKGROUND OF THE INVENTION

Currently, in the thin film transistor liquid crystal display (TFT-LCD) industry, a sealant doped with conductive gold balls (Au ball) is commonly used for conducting an upper substrate and a lower substrate to form a conductive path. When the substrates are bounded, the outer Au/Ni wrap of the conductive gold ball is capable of transporting electrons (electric conductivity required to achieve $2.4 \times 10^5$ S/cm), an elastic resin ball in the core of the conductive gold ball can buffer the pressure after bonding. In practical application, the gold ball and the sealant are mixed to form a Au adhesive, the Au adhesive is mainly composed of conductive gold ball, resin matrix, dispersing agent, curing agent, and promoter. A traditional conductive gold ball is produced by plating the surface of a resin ball with Au/Ni having diameters between 5~8 μm under a chemical plating method, the energy consumption of the method is huge, and the process is also complicated. Gold salts used in the gold plating process is usually a cyanide, which is highly toxic, the heavy metal contamination can be easily generated during this process, besides the gold is expensive, the cost is therefore increased.

A Chinese patent numbered CN10264325 discloses a polyaniline conductive particle to replace the gold ball applied in the LCD filed, the polyaniline conductive particle has greater innovation and practical value because it is able to maintain the cell gap effectively, as well as to reduce the cost; however, the conductivity of the polyaniline conductive particle is still weak compared to the other common conductive materials, such as new carbon material or metals. Moreover, another Chinese patent numbered CN20130181828 discloses a highly conductive material of a carbon nanotube produced by chemical silver plating, the nanotube has advantages of high aspect ratio and high conductivity, but the silver is expensive, and micron-size silver is more easily oxidized, hence, there is a certain risk for the stability of the material.

Therefore, it is necessary to develop a practical method with simple process, low cost, abundant raw materials, and environmentally friendly for preparing a new conductive plastic frame material.

SUMMARY OF THE INVENTION

One objective of the present disclosure is to provide a method for preparing a spherical carbon nanotube conductive ball, which is formed by applying polymer microsphere or $SiO_2$ microsphere as the matrix, and plating with nanotube material. The particle size of the carbon nanotube conductive ball is controllable, the material stability and conductivity of the carbon nanotube conductive ball are excellent.

The present disclosure further provides a method for preparing a carbon nanotube ball conductive adhesive, by replacing the commonly used conductive gold ball with the carbon nanotube adopted as the electrically conductive particle. The method is simple, low equipment requirements, low cost, and high efficiency, it can also avoid the heavy metal contamination during the production of the conductive gold ball.

To achieve the objective of the present disclosure, a method for preparing a carbon nanotube conductive ball is provided by following steps of:

Step 1, providing carbon nanotube powder and a solvent, adding the carbon nanotube powder into the solvent, extracting a supernatant from the solvent after it is treated by ultrasonication, stirring and centrifugation treatments, so as to obtain a carbon nanotube dispersion liquid with a concentration of 0.01 mg/mL~10 mg/mL.

Step 2, providing a polymer microsphere or a $SiO_2$ microsphere, adding the polymer microsphere or the $SiO_2$ microsphere into to the carbon nanotube dispersion liquid, and performing ultrasonication to obtain an uniformly dispersed mixture of carbon nanotube/polymer microsphere, or a mixture of carbon nanotube/$SiO_2$ microsphere.

Step 3, removing the solvent and impurities from the mixture of carbon nanotube/polymer microsphere or the mixture of carbon nanotube/$SiO_2$ microsphere by performing centrifugation, filtration and drying treatments to obtain a powder of the carbon nanotube conductive ball powder.

In the step 1, the solvent comprises at least one of water, ethanol, ethylene glycol, isopropanol, acetone, chloroform, N-methylpyrrolidone, tetrahydrofuran, dimethylformamide, and toluene.

The step 1 further comprises adding a surfactant to the solvent.

The surfactant comprises at least one of sodium lauryl sulfate, ammonium lauryl sulfate, sodium dodecyl sulfate, sodium dodecylbenzenesulfonate, and sodium tetradecyl sulfate.

In the step 2, the polymer microsphere comprises at least one of polystyrene, polyaniline, polypyrrole, polythiophene, and polyacrylic acid resin microsphere, a size of the polymer microspheres is uniform, a particle size of the polymer microspheres is in a range of 1~30 μm.

The present disclosure further provides a method for preparing a carbon nanotube ball conductive adhesive, comprising the following steps of:

Step 10, applying the powder of the carbon nanotube conductive ball prepared in foregoing steps.

Step 20, providing an epoxy resin, a curing agent, and a promoter, mixing and stirring until they are uniformly dispersed to obtain an epoxy colloid.

Step 30, dispersing the powder of the carbon nanotube conductive ball in the epoxy colloid with a mass ratio of 100:1~50 to obtain a preparatory material of a carbon nanotube ball conductive adhesive Step 40, degassing the preparatory material of a carbon nanotube ball conductive adhesive to obtain the carbon nanotube ball conductive adhesive.

A mass ratio of each component of the epoxy colloid obtained in the step 20 is: 80%~95% of the epoxy resin, 1%~12% of the curing agent, and 0.3%~5% of the promoter.

In the step 20, the epoxy resin is bisphenol A type epoxy resin E44, bisphenol A type epoxy resin E51, bisphenol A type epoxy resin E54, bisphenol A type epoxy resin EPON826, or bisphenol A type epoxy resin EPON828.

In the step 20, the curing agent is hexahydrophthalic anhydride, tetrahydrophthalic anhydride, succinic acid hydrazide, adipic hydrazide, dicyandiamide or p-phenylenediamine.

In the step 20, the promoter is 2-ethyl-4-methylimidazole, imidazole, dimethyl imidazole, or triethylamine.

The present disclosure further provides a method for preparing a carbon nanotube ball conductive adhesive, comprising the following steps of:

Step 10, applying the powder of the carbon nanotube conductive ball prepared in foregoing steps.

Step 20, providing an epoxy resin, a curing agent, and a promoter, mixing and stirring until they are uniformly dispersed to obtain an epoxy colloid.

Step 30, dispersing the powder of the carbon nanotube conductive ball in the epoxy colloid with a mass ratio of 100:1~50 to obtain a preparatory material of a carbon nanotube ball conductive adhesive.

Step 40, degassing the preparatory material of a carbon nanotube ball conductive adhesive to obtain the carbon nanotube ball conductive adhesive.

Wherein, a mass ratio of each component of the epoxy colloid obtained in the step 20 is: 80%~95% of the epoxy resin, 1%~12% of the curing agent, and 0.3%~5% of the promoter.

Wherein, in the step 20, the epoxy resin is bisphenol A type epoxy resin E44, bisphenol A type epoxy resin E51, bisphenol A type epoxy resin E54, bisphenol A type epoxy resin EPON826, or bisphenol A type epoxy resin EPON828.

Wherein, in the step 20, the curing agent is hexahydrophthalic anhydride, tetrahydrophthalic anhydride, succinic acid hydrazide, adipic hydrazide, dicyandiamide or p-phenylenediamine.

Wherein, in the step 20, the promoter is 2-ethyl-4-methylimidazole, imidazole, dimethyl imidazole, or triethylamine.

The present disclosure provides a method for preparing a carbon nanotube conductive ball and a method for preparing a carbon nanotube ball conductive adhesive. The method for preparing the carbon nanotube conductive ball integrates the advantages of stability of the polymer microsphere and $SiO_2$ microsphere, and high conductivity of the carbon nanotube, by applying polymer microsphere or $SiO_2$ microsphere as a matrix, and plating carbon nanotube material to obtain a spherical carbon nanotube conductive ball. The method is simple, low equipment requirements, low cost, and high efficiency; the particle size of the carbon nanotube conductive ball is controllable, the material stability and conductivity of the carbon nanotube conductive ball are excellent. The method for preparing the carbon nanotube ball conductive adhesive adopts carbon nanotube as the electrically conducting particle, which replaces the commonly used conductive gold ball in TFT-LCD, the disadvantages in traditional conductive adhesive such as high filling content, expensive price, complicated preparation process, environmental pollution, and so on are solved. Besides, the carbon nanotube ball conductive adhesive also has a great prospect in ultra-fine circuit connections.

For a better understanding of the aforementioned content of the present disclosure, preferable embodiments are illustrated in accordance with the attached figures as follows. However, the attached figures are only used for references, rather than limiting the present disclosure.

BRIEF DESCRIPTION OF THE DRAWINGS

The advantages and features of the present disclosure will become better understood with reference to the following more detailed description taken in conjunction with the accompanying drawings.

DETAILED DESCRIPTION OF THE PREFERRED EMBODIMENTS

Reference will now be made in detail to the preferred embodiments of the present disclosure, examples of which are illustrated in the accompanying drawings.

Figure 1:
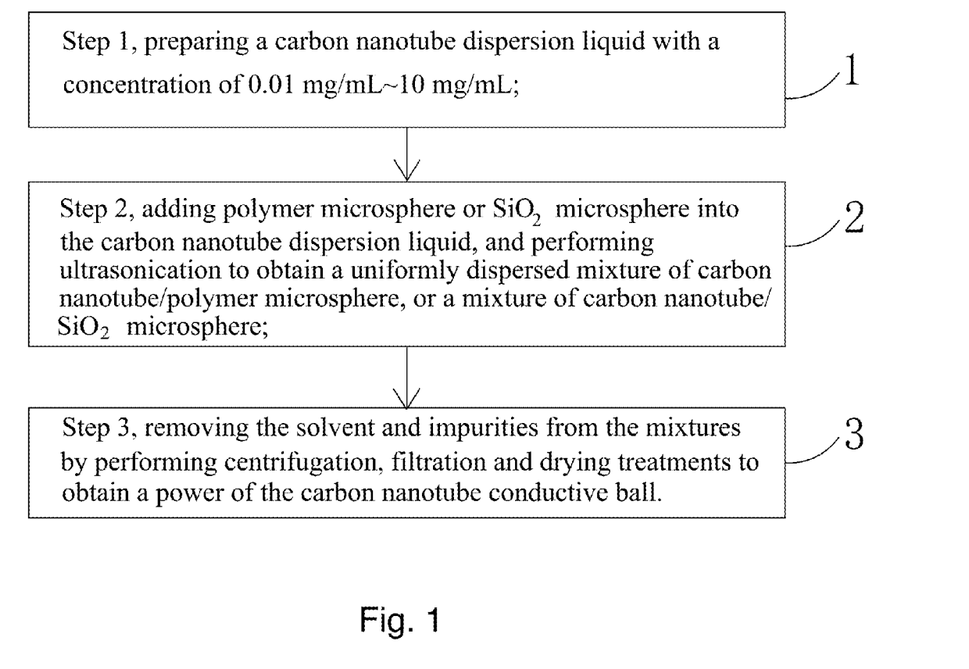
FIG. 1 is a flow chart for preparing a carbon nanotube conductive ball of the present disclosure.

Please refer to FIG. 1, the present disclosure provides a carbon nanotube conductive ball, comprising the steps of:

Step 1, providing carbon nanotube powder and a solvent, and adding the carbon nanotube powder into the solvent. Preferably, a surfactant can be added to the solvent for uniformly dispersing the carbon nanotube. Extracting a supernatant from the solvent after it is treated with ultrasonication, stirring and centrifugation treatments, so as to obtain a carbon nanotube dispersion liquid with a concentration of 0.01 mg/mL~10 mg/mL;

Specifically, the solvent comprises at least one of water, ethanol, ethylene glycol, isopropanol, acetone, chloroform, N-methylpyrrolidone, tetrahydrofuran, dimethylformamide, and toluene. The surfactant comprises at least one of sodium lauryl sulfate, ammonium lauryl sulfate, sodium dodecyl sulfate, sodium dodecylbenzenesulfonate, and sodium tetradecyl sulfate.

Step 2, providing a polymer microsphere or a $SiO_2$ microsphere, adding the polymer microsphere or the $SiO_2$ microsphere into to the carbon nanotube dispersion liquid, and then performing ultrasonication to the carbon nanotube dispersion liquid to obtain a uniformly dispersed mixture of carbon nanotube/polymer microsphere, or a mixture of carbon nanotube/$SiO_2$ microsphere.

Specifically, the polymer microsphere comprises at least one of polystyrene, polyaniline, polypyrrole, polythiophene, and polyacrylic acid resin microsphere. A size of the polymer microsphere is uniform; a particle size of the polymer microsphere is in a range of 1~30 μm.

Figure 2:
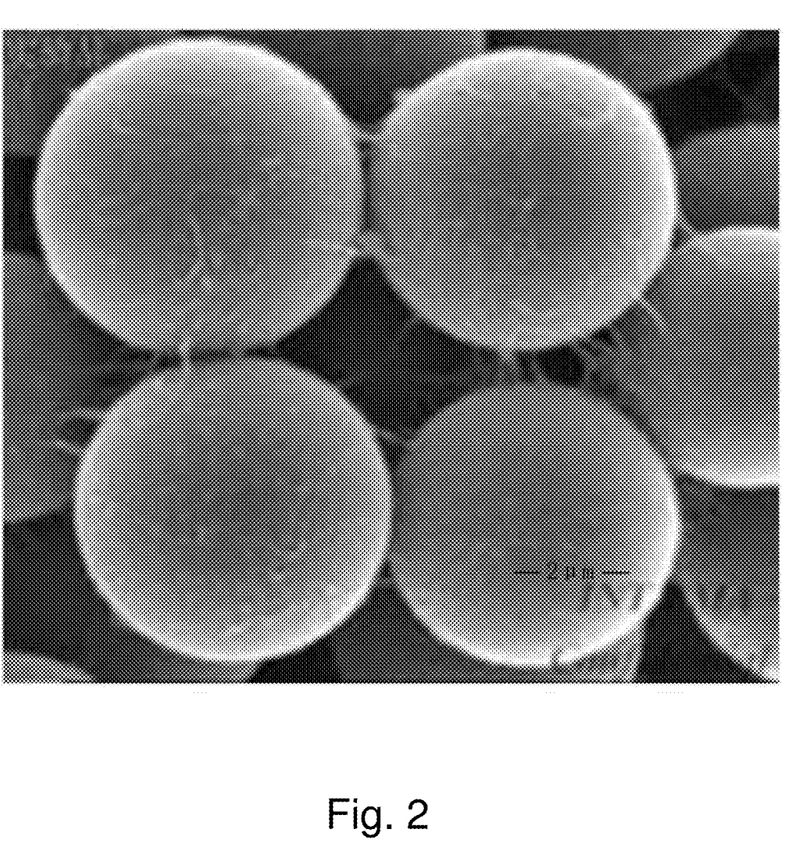
FIG. 2 is a scanning electron micrograph picture of a carbon nanotube conductive ball of the present disclosure.

Step 3, removing the solvent and impurities from the mixture of carbon nanotube/polymer microsphere or from the mixture of carbon nanotube/$SiO_2$ microsphere by sequentially performing centrifugation, filtration and drying treatments to the mixtures, so as to obtain a powder of the carbon nanotube conductive ball. Specifically, please refer to FIG. 2 for the scanning electron micrograph picture of the carbon nanotube conductive ball provided by the present disclosure, the carbon nanotube conductive ball of the present disclosure is spherical.

Specifically, in the step 3, the filtration treatment can be followed by repeatedly washing the mixtures with ethanol and water, so as to remove the impurities from the mixtures.

The carbon nanotube conductive ball provided by the present disclosure integrates the advantage of stability of the polymer microsphere, the $SiO_2$ microsphere, and the advantage of high conductivity of the carbon nanotube, by applying the polymer microsphere or the $SiO_2$ microsphere as the matrix, and plating the carbon nanotube material to obtain the spherical carbon nanotube conductive ball. The preparation of the carbon nanotube conductive ball is simple, low equipment requirements, abundant raw materials, low cost, and high efficiency.

The particle size of the carbon nanotube conductive ball provided by the present disclosure is controllable, the material stability and conductivity of the carbon nanotube conductive ball are excellent, and it is also environmentally friendly. The carbon nanotube conductive ball is capable of replacing the conductive gold ball and being used as the conductive adhesive of the LCD. Besides, the carbon nanotube conductive ball can also be used as a conductive ink, which has potential commercial value in the field of flexible circuits.

Figure 3:
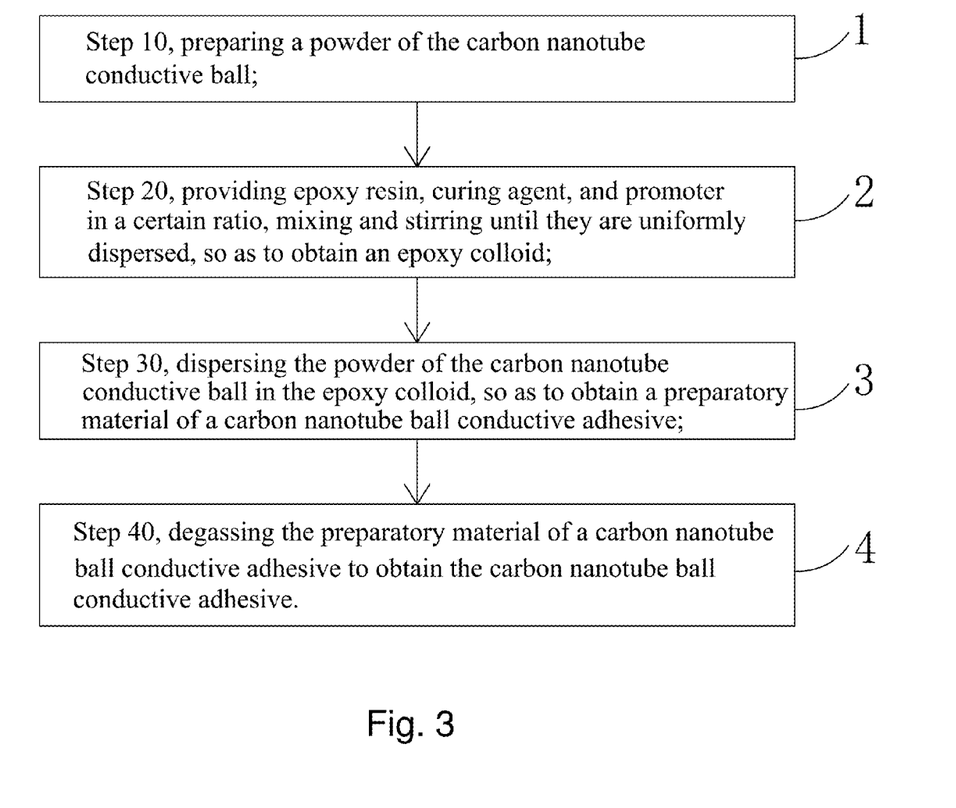
FIG. 3 is a flow chart for preparing a carbon nanotube ball conductive adhesive of the present disclosure.

Please refer to FIG. 3, the present disclosure further provides a method for preparing a carbon nanotube ball conductive adhesive, comprising the following steps of:

Step 10, applying the powder of the carbon nanotube conductive ball prepared in foregoing steps. Preferably, the carbon nanotube conductive ball produced by foregoing steps is obtained by adopting the polymer microsphere as the matrix, and plating the carbon nanotube material. Since the polymer microsphere as the matrix has a certain elasticity, when the carbon nanotube ball conductive adhesive prepared by the carbon nanotube conductive ball is applied to the LCD panel, the elastic spherical filler can evaluate the conduction between the upper substrate and the lower substrate, while making no damages to the substrates. Especially in the vacuum bonding process of the two substrates in the LCD panel, there are some inevitable forces on two sides of the substrates.

Step 20, providing an epoxy resin, a curing agent, and a promoter. Mixing and stirring until they are uniformly dispersed, so as to obtain an epoxy colloid.

Specifically, a mass ratio of each component of the epoxy colloid obtained is: 80%~95% of the epoxy resin, 1%~12% of the curing agent, and 0.3%~5% of the promoter.

Specifically, the epoxy resin is bisphenol A type epoxy resin E44, bisphenol A type epoxy resin E51, bisphenol A type epoxy resin E54, bisphenol A type epoxy resin EPON826, or bisphenol A type epoxy resin EPON828. The curing agent is hexahydrophthalic anhydride, tetrahydrophthalic anhydride, succinic acid hydrazide, adipic hydrazide, dicyandiamide or p-phenylenediamine. The promoter is 2-ethyl-4-methylimidazole, imidazole, dimethyl imidazole, or triethylamine.

Step 30, dispersing the powder of the carbon nanotube conductive ball in the epoxy colloid with a mass ratio of 100:1~50 to obtain a preparatory material of a carbon nanotube ball conductive adhesive.

Figure 4:
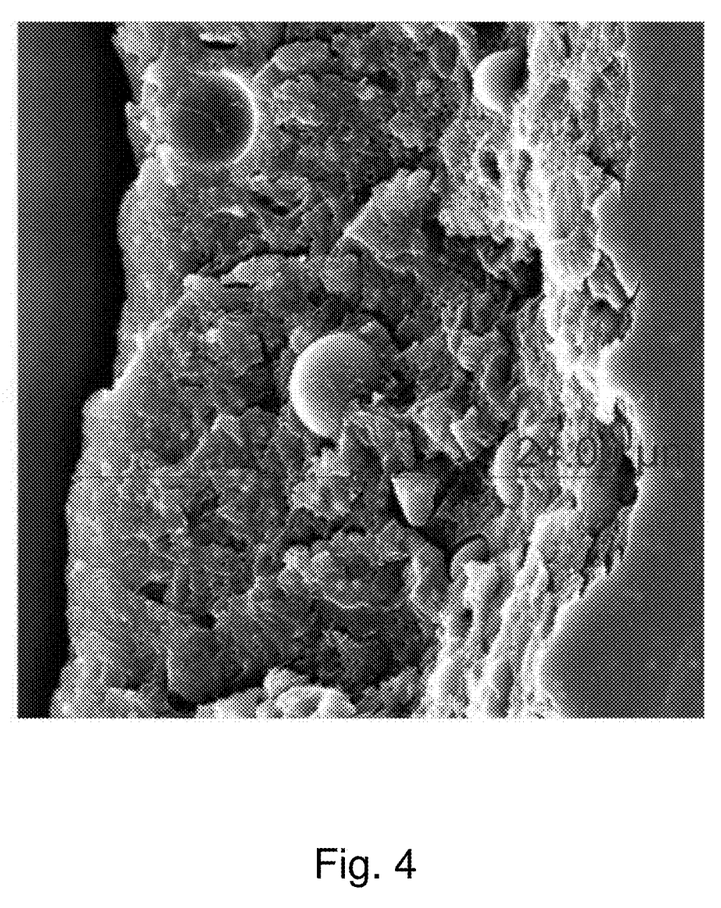
FIG. 4 is a schematic cross-sectional diagram of a carbon nanotube ball conductive adhesive of the present disclosure.

Step 40, degassing the preparatory material of a carbon nanotube ball conductive adhesive to obtain the carbon nanotube ball conductive adhesive. Preferably, please refer to FIG. 4 for the scanning electron micrograph picture of the carbon nanotube ball conductive adhesive provided by the present disclosure.

Figure 5:
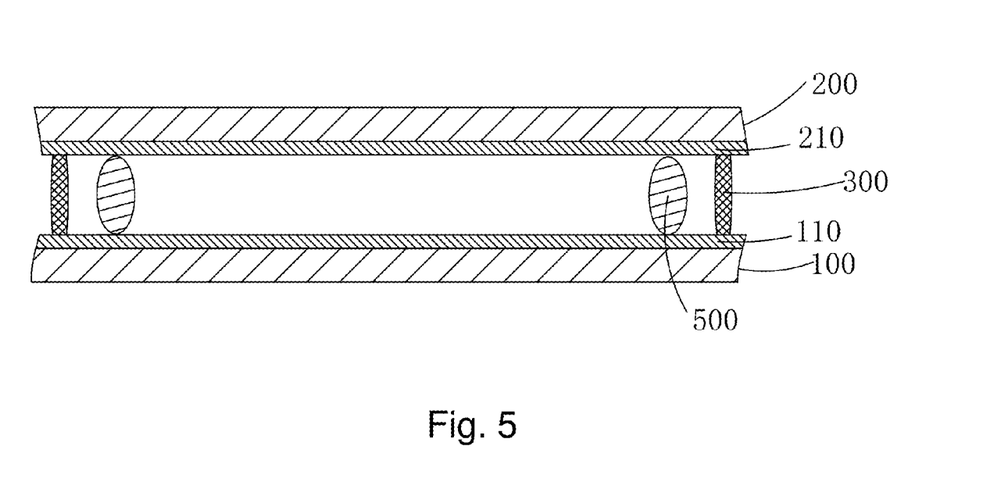
FIGS. 5-6 are structural diagram of a carbon nanotube ball conductive adhesive of the present invention being applied in TFT-LCD.
Figure 6:
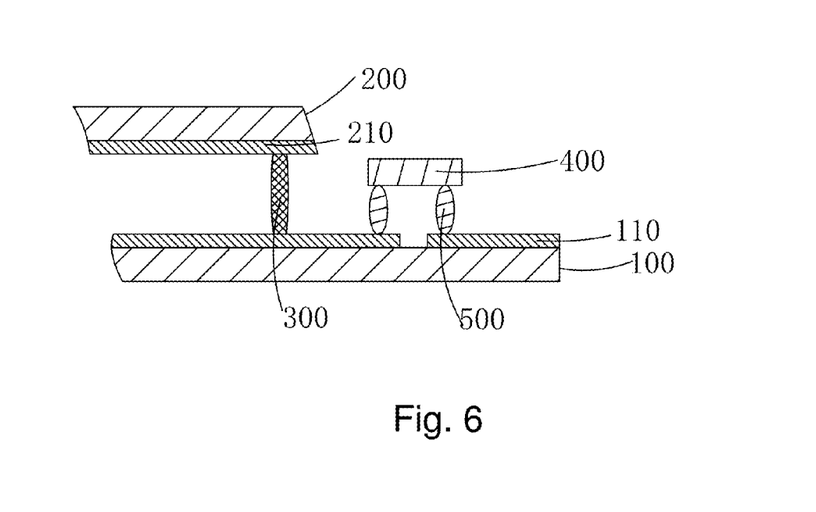

Specifically, the carbon nanotube ball conductive adhesive of the present disclosure adopts the carbon nanotube conductive ball as the filler, which can be applied in the TFT-LCD filed. As shown in FIGS. 5-6, the carbon nanotube ball conductive adhesive 500 can be disposed inside a plastic frame 300, used for connecting an electrode 110 of an array substrate 100 and an electrode 210 of a color filter substrate 200, so that the electrodes of the array substrate and the color filter substrate are conducted. The carbon nanotube ball conductive adhesive can also be disposed outside the plastic frame 300, used for connecting the electrode 110 of the array substrate 100 and a IC chip 400.

The method for preparing the carbon nanotube ball conductive adhesive provided by the present disclosure adopts the carbon nanotube conductive ball as the electrically conducting ball, which replaces the commonly used conductive gold ball in the TFT-LCD field, the disadvantages in traditional conductive adhesive such as high filling content, expensive price, complicated preparation process, environmental pollution, and so on are solved. Besides, the carbon nanotube ball conductive adhesive also has a great prospect in ultra-fine circuit connections.

Preferred embodiments of the carbon nanotube conductive ball and the carbon nanotube ball conductive adhesive provides by the present disclosure are illustrated as follows.

EMBODIMENT 1

A. The Preparation of the Carbon Nanotube Conductive Ball

Adding 6 mg of carbon nanotube powder in 10 ml of deionized water, adding ammonium lauryl sulfate therein, and extracting a supernatant after performing ultrasonication for 1 hour, magnetic stirring for 30 minutes, and centrifugation, to obtain a carbon nanotube dispersion liquid; adding 60 mg of polystyrene microsphere having a particle size of 5.7 μm to the carbon nanotube dispersion liquid, performing stirring and ultrasonication until the carbon nanotube and the polystyrene microsphere together form a stable and uniform suspension liquid. Performing centrifugation to the carbon nanotube/polystyrene microsphere suspension liquid, and sampling its solid. Particularly, the solid sampling steps are washing the suspension liquid three times with 90 mL of ethanol and 120 mL of deionized water, repeatedly centrifuging the suspension liquid, and sampling the solid. Placing the solid in a vacuum oven, drying at 70° C. for 24 hours to obtain a composite material of carbon nanotube/polystyrene conductive ball, that is, the carbon nanotube conductive ball as descripted in the present disclosure.

B. The Preparation of the Carbon Nanotube Ball Conductive Adhesive

Weighting each component in the following ratio: 93% of bisphenol A type epoxy resin E44, 6% of hexahydrophthalic anhydride, and 1% of 2-ethyl-4-methylimidazole. Mixing and stirring the above components until they are uniformly dispersed, so as to obtain an epoxy resin colloid. Adding the carbon nanotube conductive ball obtained in the above step A into the epoxy resin colloid, in which a mass ratio of the epoxy resin colloid and the carbon nanotube conductive ball is 50:1. Mixing and stirring the epoxy resin colloid and the carbon nanotube conductive ball until they are uniformly dispersed, so as to obtain a preparatory material of the carbon nanotube ball conductive adhesive. Placing the preparatory material of the carbon nanotube ball conductive adhesive in a vacuum deaeration machine at 0.7 KPa, 500 rpm, degassing for 30 minutes, so as to obtain the carbon nanotube conductive ball adhesive.

EMBODIMENT 2

A. The Preparation of the Carbon Nanotube Conductive Ball

Adding 5 mg of carbon nanotube powder in 10 ml of ethanol, extracting a supernatant after performing ultrasonication for 50 minutes, magnetic stirring for 1 hour, and centrifugation, to obtain a carbon nanotube dispersion liquid; adding 50 mg of polyaniline microspheres having a particle size of 5 μm to the carbon nanotube dispersion liquid, and performing ultrasonication to obtain a uniformly dispersed carbon nanotube/polyaniline microsphere suspension liquid. Performing centrifugation to the carbon nanotube/polyaniline microsphere suspension liquid, and sampling its solid. Particularly, the solid sampling steps are washing the suspension liquid three times with 100 mL of deionized water, repeatedly centrifuging the suspension liquid, and sampling the solid. Placing the solid in a vacuum oven, drying at 80° C. for 20 hours to obtain a composite material of carbon nanotube/polyaniline microsphere, that is, the carbon nanotube conductive ball as described in the present disclosure.

B. The Preparation of the Carbon Nanotube Ball Conductive Adhesive

Weighting each component in the following ratio: 89% of bisphenol A type epoxy resin EPON826, 9% of hexahydrophthalic anhydride, and 2% of triethylamine. Mixing and stirring the above components until they are uniformly dispersed, so as to obtain an epoxy resin colloid. Adding the powder of the carbon nanotube conductive ball obtained in the above step A into the epoxy resin colloid, in which a mass ratio of the epoxy resin colloid and the carbon nanotube conductive ball is 15:1. Mixing and stirring the epoxy resin colloid and the carbon nanotube conductive ball until they are uniformly dispersed, so as to obtain a preparatory material of the carbon nanotube ball conductive adhesive. Placing the preparatory material of the carbon nanotube ball conductive adhesive in a vacuum deaeration machine at 0.7 KPa, 500 rpm, degassing for 30 minutes, so as to obtain the carbon nanotube conductive ball adhesive.

As described above, the method for preparing the carbon nanotube conductive ball provided by the present disclosure integrates the advantages of stability of the polymer microsphere, $SiO_2$ microsphere, and high conductivity of the carbon nanotube, by applying the polymer microsphere or $SiO_2$ microsphere as the matrix, and plating carbon nanotube material to obtain the spherical carbon nanotube conductive ball. The method is simple, low equipment requirements, abundant raw materials, low cost, and high efficiency, the particle size of the carbon nanotube conductive ball is controllable, the material stability and conductivity of the carbon nanotube conductive ball is excellent, and it is also environmentally friendly. The carbon nanotube conductive ball is capable of replacing the conductive gold ball that is commonly used in TFT-LCD, besides, it can also be used as a conductive ink, which has potential commercial value in the field of flexible circuits.

The method for preparing the carbon nanotube ball conductive adhesive provided by the present disclosure adopts the carbon nanotube ball as the electrically conducting ball, which replaces the commonly used conductive gold ball in the TFT-LCD field, the disadvantages in traditional conductive adhesive such as high filling content, expensive price, complicated preparation process, environmental pollution, and so on are solved. Besides, the carbon nanotube ball conductive adhesive also has a great prospect in ultra-fine circuit connections.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims, rather than the foregoing description and the exemplary embodiments described therein.

What is claimed is:

1. A method for preparing a carbon nanotube conductive ball, comprising the steps of:
    step 1, providing carbon nanotube powder and a solvent, adding the carbon nanotube powder into the solvent, extracting a supernatant from the solvent after it is treated by ultrasonication, stirring and centrifugation treatments, so as to obtain a carbon nanotube dispersion liquid with a concentration of 0.01 mg/mL~10 mg/mL;
    step 2, providing a polymer microsphere or a $SiO_2$ microsphere, adding the polymer microsphere or the $SiO_2$ microsphere into to the carbon nanotube dispersion liquid, and performing ultrasonication to obtain a uniformly dispersed mixture of carbon nanotube/polymer microsphere, or a mixture of carbon nanotube/$SiO_2$ microsphere;
    step 3, removing the solvent and impurities from the mixture of carbon nanotube/polymer microsphere or the mixture of carbon nanotube/$SiO_2$ microsphere by performing centrifugation, filtration and drying treatments to obtain a powder of the carbon nanotube conductive ball.

2. The method for preparing a carbon nanotube conductive ball as claimed in claim 1, wherein in the step 1, the solvent comprises at least one of water, ethanol, ethylene glycol, isopropanol, acetone, chloroform, N-methylpyrrolidone, tetrahydrofuran, dimethylformamide, and toluene.

3. The method for preparing a carbon nanotube conductive ball as claimed in claim 1, wherein the step 1 further comprises adding a surfactant to the solvent.

4. The method for preparing a carbon nanotube conductive ball as claimed in claim 3, wherein the surfactant comprises at least one of sodium lauryl sulfate, ammonium lauryl sulfate, sodium dodecyl sulfate, sodium dodecylbenzenesulfonate, and sodium tetradecyl sulfate.

5. The method for preparing a carbon nanotube conductive ball as claimed in claim 1, wherein in the step 2, the polymer microsphere comprises at least one of polystyrene, polyaniline, polypyrrole, polythiophene, and polyacrylic acid resin microsphere, a size of the polymer microspheres is uniform, a particle size of the polymer microspheres is in a range of 1~30 μm.

6. A method for preparing a carbon nanotube ball conductive adhesive, comprising the steps of:
    step 10, applying the powder of the carbon nanotube conductive ball prepared in claim 1;
    step 20, providing an epoxy resin, a curing agent, and a promoter, mixing and stirring until they are uniformly dispersed to obtain an epoxy colloid;
    step 30, dispersing the powder of the carbon nanotube conductive ball in the epoxy colloid with a mass ratio of 100:1~50 to obtain a preparatory material of a carbon nanotube ball conductive adhesive;
    step 40, degassing the preparatory material of a carbon nanotube ball conductive adhesive to obtain the carbon nanotube ball conductive adhesive.

7. The method for preparing a carbon nanotube ball conductive adhesive as claimed in claim 6, wherein a mass ratio of each component of the epoxy colloid obtained in the step 20 is: 80%~95% of the epoxy resin, 1%~12% of the curing agent, and 0.3%~5% of the promoter.

8. The method for preparing a carbon nanotube ball conductive adhesive as claimed in claim 6, wherein in the step 20, the epoxy resin is bisphenol A type epoxy resin E44, bisphenol A type epoxy resin E51, bisphenol A type epoxy resin E54, bisphenol A type epoxy resin EPON826, or bisphenol A type epoxy resin EPON828.

9. The method for preparing a carbon nanotube ball conductive adhesive as claimed in claim 6, wherein in the step 20, the curing agent is hexahydrophthalic anhydride, tetrahydrophthalic anhydride, succinic acid hydrazide, adipic hydrazide, dicyandiamide or p-phenylenediamine.

10. The method for preparing a carbon nanotube ball conductive adhesive as claimed in claim 6, wherein in the step 20, the promoter is 2-ethyl-4-methylimidazole, imidazole, dimethyl imidazole, or triethylamine.

11. A method for preparing a carbon nanotube ball conductive adhesive, comprising the steps of:
   step 10, applying the powder of the carbon nanotube conductive ball powder prepared in claim 1;
   step 20, providing an epoxy resin, a curing agent, and a promoter, mixing and stirring until they are uniformly dispersed to obtain an epoxy colloid;
   step 30, dispersing the powder of the carbon nanotube conductive ball powder in the epoxy colloid with a mass ratio of 100:1~50 to obtain a preparatory material of a carbon nanotube ball conductive adhesive;
   step 40, degassing the preparatory material of a carbon nanotube ball conductive adhesive to obtain the carbon nanotube ball conductive adhesive;
   wherein, a mass ratio of each component of the epoxy colloid obtained in the step 20 is: 80%~95% of the epoxy resin, 1%~12% of the curing agent, and 0.3%~5% of the promoter;
   wherein, in the step 20, the epoxy resin is bisphenol A type epoxy resin E44, bisphenol A type epoxy resin E51, bisphenol A type epoxy resin E54, bisphenol A type epoxy resin EPON826, or bisphenol A type epoxy resin EPON828;
   wherein, in the step 20, the curing agent is hexahydrophthalic anhydride, tetrahydrophthalic anhydride, succinic acid hydrazide, adipic hydrazide, dicyandiamide or p-phenylenediamine; and
   wherein, in the step 20, the promoter is 2-ethyl-4-methylimidazole, imidazole, dimethyl imidazole, or triethylamine.

\* \* \* \* \*